(12) United States Patent  (10) Patent No.: US 7,944,048 B2
Jiang  (45) Date of Patent: May 17, 2011

(54) CHIP SCALE PACKAGE FOR POWER DEVICES AND METHOD FOR MAKING THE SAME

(75) Inventor: Hunt H. Jiang, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 711 days.

(21) Appl. No.: 11/835,232

(22) Filed: Aug. 7, 2007

(65) Prior Publication Data

US 2008/0035959 A1 Feb. 14, 2008

Related U.S. Application Data

(60) Provisional application No. 60/836,746, filed on Aug. 9, 2006.

(51) Int. Cl.
*H01L 23/04* (2006.01)
*H01L 23/48* (2006.01)

(52) U.S. Cl. .. 257/737; 257/750; 257/698; 257/E23.069

(58) Field of Classification Search ................ 257/737, 257/738, 750, E23.069
See application file for complete search history.

(56) References Cited

U.S. PATENT DOCUMENTS

| | | | | |
|---|---|---|---|---|
| 5,834,844 A * | 11/1998 | Akagawa et al. | ............. | 257/734 |
| 5,925,931 A * | 7/1999 | Yamamoto | ..................... | 257/737 |
| 6,187,615 B1 * | 2/2001 | Kim et al. | ...................... | 438/113 |
| 6,900,538 B2 * | 5/2005 | Alter et al. | ..................... | 257/738 |
| 6,927,471 B2 * | 8/2005 | Salmon | ......................... | 257/499 |
| 7,768,075 B2 * | 8/2010 | Yilmaz et al. | ................ | 257/401 |
| 2003/0197278 A1 * | 10/2003 | Joshi et al. | .................... | 257/772 |
| 2005/0062156 A1 * | 3/2005 | Alter et al. | .................... | 257/738 |

\* cited by examiner

*Primary Examiner* — Nitin Parekh
(74) *Attorney, Agent, or Firm* — Perkins Coie LLP

(57) ABSTRACT

A chip scale package is disclosed that includes a semiconductor die further comprising an array of power buses electrically coupled to a high power integrated circuit, and a plurality of Under Bump Metallization (UBM) multi-layer power buses disposed parallel to one another and spanning substantially across the entire length of the semiconductor die. The plurality of multi-layer UBM power buses, electrically coupled to the array of power buses, further includes a thick metal layer configured in a geometric shape that have interconnection balls completely posited thereupon.

21 Claims, 5 Drawing Sheets

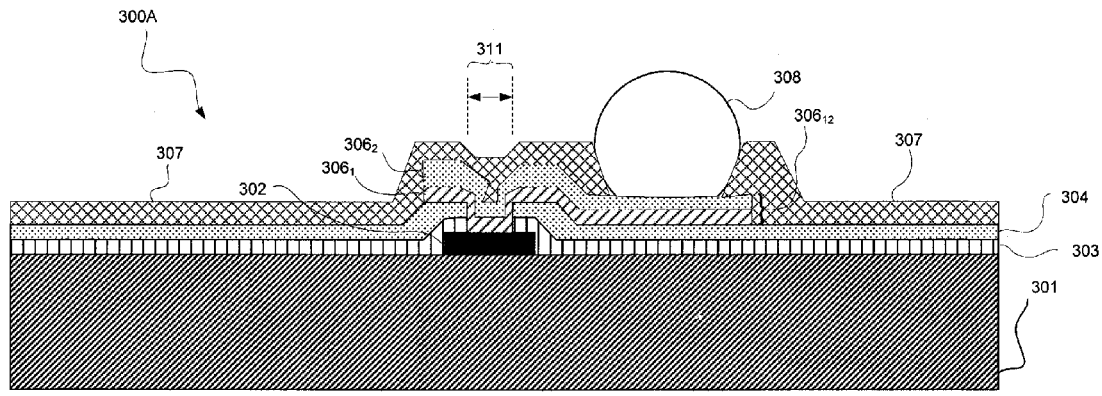
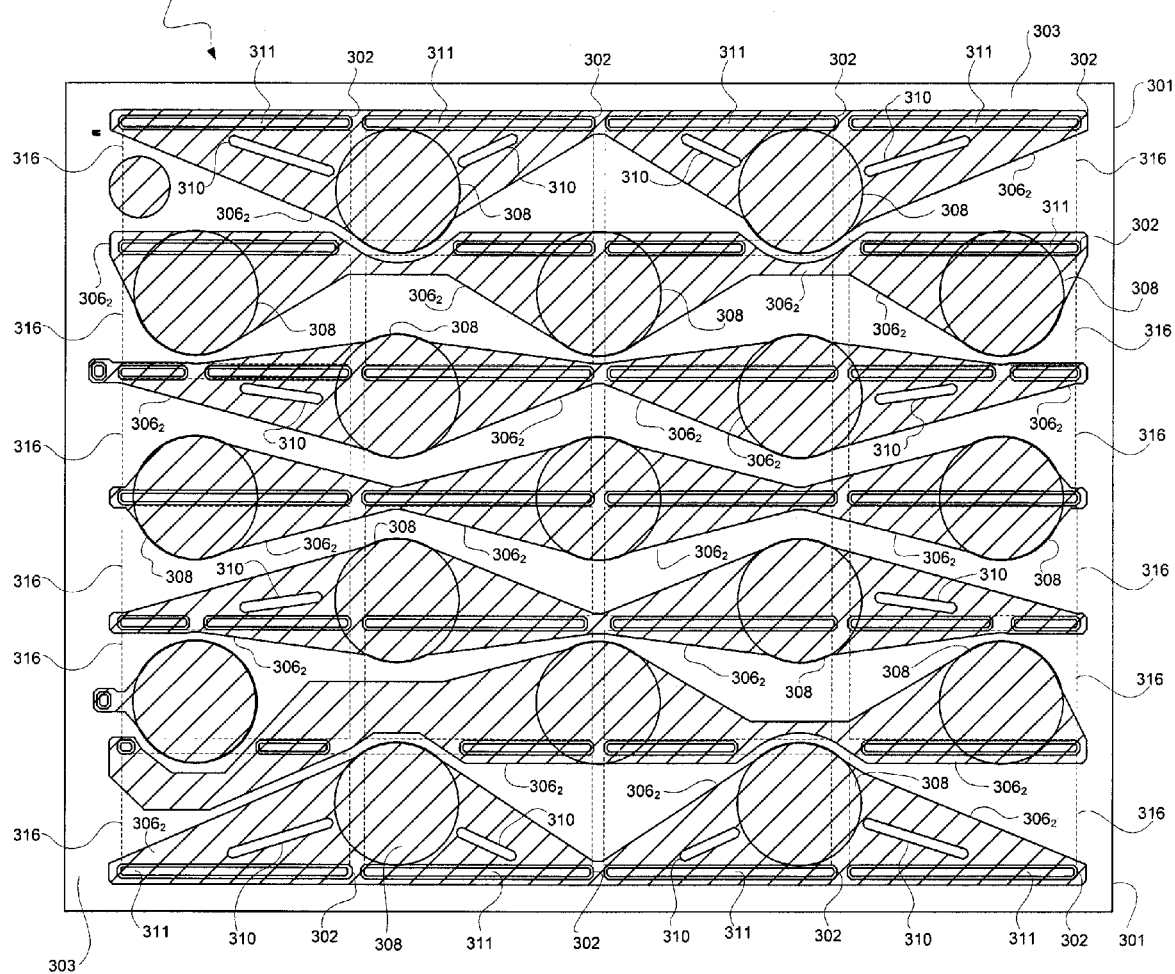

CHIP SCALE PACKAGE FOR POWER DEVICES AND METHOD FOR MAKING THE SAME

REFERENCE TO RELATED APPLICATION

This application claims the benefit of the filing date of U.S. provisional application Ser. No. 60/836,746, filed on Aug. 9, 2006, and incorporated herein by reference.

FIELD OF THE INVENTION

The present invention relates generally to the field of semiconductor device packaging technology, and more specifically, to chip scale packaging with a flip chip interconnection.

BACKGROUND ART

In current chip scale package technology, the typical size of a chip scale package is reduced to a dimension that is relatively close to that of a silicon die. At the same time, the demand for high current and low voltage supply in modern chips that contain integrated circuits, such as high power switch-mode voltage regulator circuits (power devices), continues to increase. Accordingly, chip manufacturers are faced with trade-offs between high current handling capability and the device size of such a power device. That is, in order to achieve high current handling capability, the device size has to be both thick and large in order to handling high power and enable heat to dissipate from the power device. On the other hand, in order to reduce the size of a power device, the current handled by each power device is generally reduced.

FIG. 1A illustrates a top plan view of a prior art semiconductor die 100 that exhibits the trade-off between the die size and its current handling capability. Prior art semiconductor die 100 includes a substrate 101, a passivation layer 102, bond pads 103, and an array of contact areas 104. Substrate 101 further includes a preformed integrated circuit, such as high power switch-mode voltage regulator integrated circuits and metal conductive traces (not shown). Passivation layer 102, such as a silicon dioxide ($SiO_2$) or a silicon nitrate ($Si_3N_4$) film, is disposed over substrate 101 and bond pads 103. Bond pads 103 may include source electrodes, drain electrodes, and gate electrodes of high power switch-mode voltage regulator integrated circuits. A plurality of openings is formed on passivation layer 102 directly over bond pads 103 to create the array of contact areas 104.

FIG. 1B illustrates a side view of prior art semiconductor die 100 of FIG. 1A taken along the width (Y-dimension) of contact area 104. As shown, prior-art semiconductor die 100 includes substrate 101 having bond pads 103 overlaid by a passivation layer 102. Passivation layer 102 includes openings over bond pads 103 that define contact areas 104. FIG. 1C illustrates a side view of the prior art semiconductor die 100 of FIG. 1A taken along the length (X-dimension) of contact areas 104. As shown, each conventional metal contact area 104 has its length (X-dimension) equal to its width (Y-dimension). When a switch-mode voltage regulator integrated circuit carrying a large current is used in semiconductor die 100, power efficiency is degraded because high conduction loss results in heat dissipation due to high interconnection resistance. At a high current and power efficiency level, there are three main areas in an integrated circuit device where interconnection resistance can be reduced: in the circuit package, in the component, and in the interconnects. Among them, the circuit package and the interconnects are the most important factors that contribute to high interconnect resistance. This is especially true when the "ON" drain to source resistance ($R_{DS(ON)}$) has been intentionally decreased due to the improvement in semiconductor manufacturing process. Therefore, a chip scale package containing high-power transistors that achieve low interconnection resistance is crucial to the performance and operability of today consumer electronics.

Semiconductor die 100 and its chip scale package cannot further reduce interconnection resistance when the demand for high current handling capability continues to increase. This is because the prior-art chip scale package that houses semiconductor die 100 does not have any capability to reduce interconnection resistance which becomes more and more significant as the amount of output current increases. Furthermore, as semiconductor die 100 and contact areas 104 become smaller, the corresponding current density in contact pads 104 becomes larger. High current density can cause device failures due to electro-migration of aluminum particles of contact areas 104 into substrate 101. Eventually, the electro-migration phenomenon causes open-circuits in the prior-art chip scale package that contains semiconductor die 100.

SUMMARY OF THE INVENTION

The present invention is a chip scale package for a high power integrated circuit that includes a semiconductor die, a plurality of multi-layer Under Bump Metallization (UBM) power buses disposed parallel to one another and running substantially across the entire length of the semiconductor die. The plurality of multi-layer UBM power buses, each comprising a thick metal layer, is electrically coupled to communicate with the high power integrated circuit via the array of power buses. Each multi-layer UBM power bus is configured in such a geometrical shape that interconnection bumps are posited thereupon.

The present invention also is a method of forming a chip scale package for a high power integrated circuit. The method includes the steps of forming an integrated circuit on a semiconductor die; forming an array of power buses over the high power integrated circuit; forming multi-layer Under Bump Metallization (UBM) power buses, each including a thick metal layer that is electrically coupled to the high power integrated circuit via the array of power buses, that are parallel to one another; and forming an array of interconnection balls on the multi-layer UBM power buses.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 3A illustrates a schematic sectional diagram of a semiconductor die having a substrate, a passivation layer, a power bus, a first dielectric layer, a multi-layer Under Bump Metallization (BUM) power bus having a geometric shape extending away from an edge of an opening that defines the contact areas, a second dielectric layer, and an interconnection ball that is posited onto the extended portion of the multi-layer UBM power bus in accordance with an embodiment of the present invention.

FIG. 3B illustrates a top view of a chip scale package, that houses the semiconductor die of FIG. 3A, having an array of power buses, parallel multi-layer Under Bump Metallization (UBM) power buses that are extended from one side of the power buses where interconnection balls can be deposited in accordance with an embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1A:
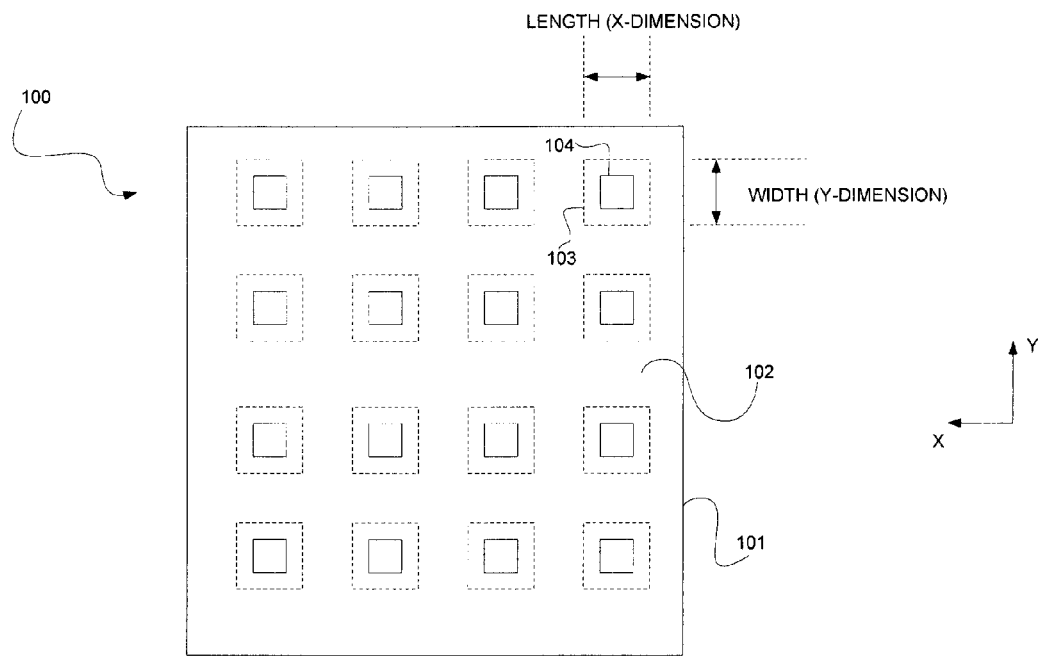
FIG. 1A illustrates a top plan view layout of a prior art semiconductor die having an array of metal contact areas each having a length (X-dimension) that substantially equals a width (Y-dimension).
Figure 1B:
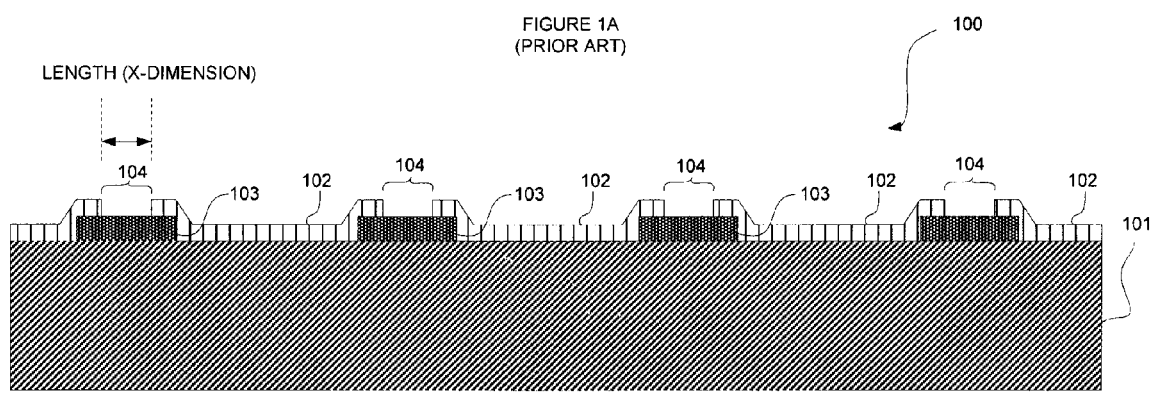
FIG. 1B illustrates a cross-sectional view taken along the Y-dimension of the prior art semiconductor die of FIG. 1A that shows a substrate, a passivation layer, bond pads, and contact areas.
Figure 1C:
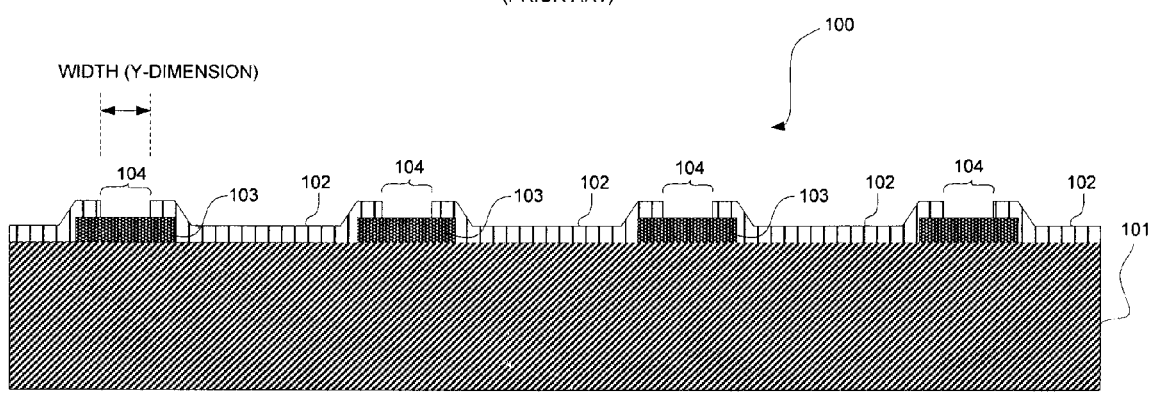
FIG. 1C illustrates a cross-sectional view taken along the X-dimension of the semiconductor die of FIG. 1A that shows the substrate, the passivation layer, the bond pads, and the metal contact areas.
Figure 2A:
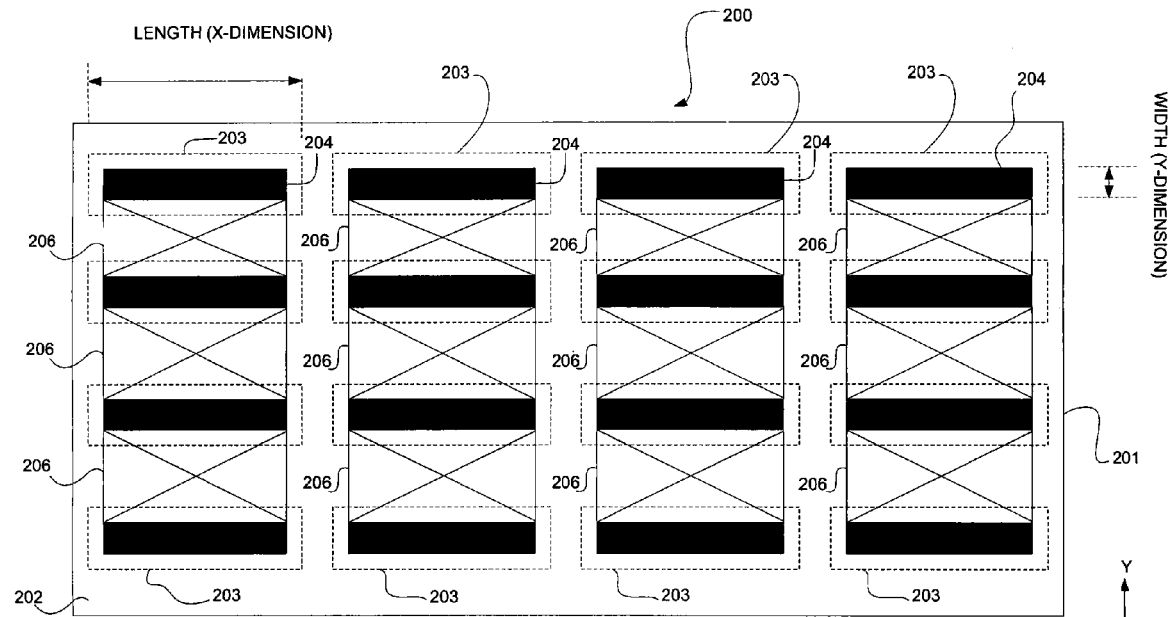
FIG. 2A illustrates a top plan view of a die level floor plan that has an array of power buses electrically connected to a transistor bank in accordance with an embodiment of the present invention.
Figure 2B:
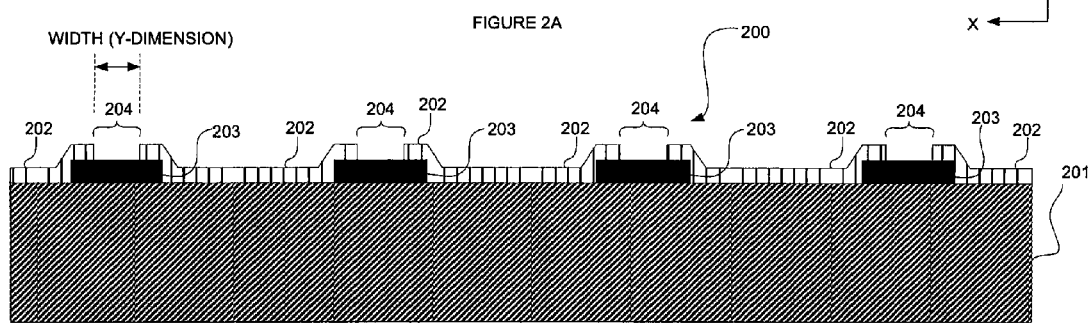
FIG. 2B illustrates a cross-sectional view of the semiconductor die of FIG. 2A taken along the Y-dimension that shows a substrate, a passivation layer, an array of power buses, and contact areas in accordance with an embodiment of the present invention.
Figure 2C:
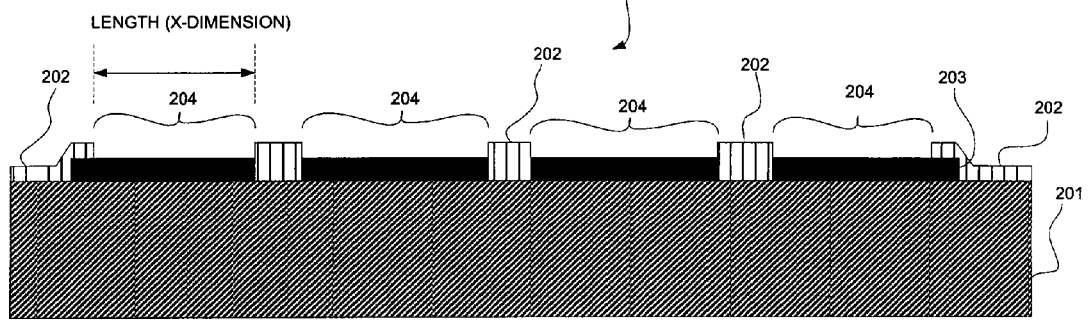
FIG. 2C illustrates a cross-sectional view of the semiconductor die of FIG. 2A taken along the X-dimension that shows the substrate, the passivation layer, and the power buses in accordance with an embodiment of the present invention.

With reference to the illustrations of FIG. 2A, FIG. 2B, and FIG. 2C, an exemplary geometry and layout of a high power transistor integrated circuit according to the present invention are illustrated.

Referring to FIG. 2A, a top plan view of a semiconductor die 200 that contains a high power integrated circuit is illustrated. The high power integrated circuit includes an array of power buses 203 disposed directly over a substrate 201. In one embodiment, array of power buses 203 is a part of the regular top metal layer of substrate 201. In one embodiment, substrate 201 may include a preformed high power integrated circuit such as Double Diffused Metal Oxide Semiconductor (DMOS) switch-mode voltage regulator (not shown). In one embodiment of the present invention, high power integrated circuit includes an array of transistor banks 206. Each transistor bank 206 is fabricated between two power buses 203. In the illustrated embodiment of FIG. 2A, the top power bus 203 represents a drain metal of transistor bank 206 and the bottom power bus 206 represents the source metal of transistor bank 206. In one embodiment of the present invention, each of power bus 203 runs substantially across the entire length of substrate 201 and are parallel to each other. Thereafter, a passivation layer 202 overlays the entire area of substrate 201 and array of power buses 203. Openings are etched in passivation layer 202, along the length of each power bus 203 to form an array of contact areas 204.

Now referring to FIG. 2B, a cross section view taken along the width (Y-dimension) of semiconductor die 200 of FIG. 2A is shown. More particularly, FIG. 2B shows all vertical layers of semiconductor die 200 that includes substrate 201 with pre-formed high power integrated circuit covered by passivation layer 202 having openings over array of power buses 203. Each opening defines contact area 204. From the Y-dimension perspective, the width of each of four power buses is substantially smaller than the length of substrate 201. In one embodiment of the present invention, the width (Y-dimension) of contact are 204 is approximately 20 to 200 microns (µm).

FIG. 2C illustrates a cross section view of semiconductor die 200 of FIG. 2A taken along the length (X-dimension). FIG. 2C shows the same structural layers of semiconductor die 200 as in FIG. 2B except that the length of each power bus 203 is shown. The length of each power bus 203 runs substantially across the length of substrate 201. In one embodiment of the present invention, the length of power bus 203 is approximately between 200 to 2000 microns (µm). In manufacturing, semiconductor die 200 of the present invention that includes array of power buses 203 can be made by conventional processes.

With such a geometric structure and dimensions, array of contact areas 204 increases the total effective cross sectional area of high power integrated circuit, thus reducing interconnection resistance and enhancing large current handling capability of preformed integrated circuit in substrate 201.

Now referring to FIG. 3A, a cross sectional diagram of a semiconductor die 300 in accordance with an embodiment of the present invention is illustrated. As shown, semiconductor die 300 includes an array of power buses 302 disposed over substrate 301, a passivation layer 303 overlaying the array of power buses 302, an optional first dielectric layer 304 disposed over passivation layer 303, multi-layer Under Bump Metallization (UBM) power buses $306_{12}$ disposed over first dielectric layer 304, a second dielectric layer 307 disposed over multi-layer UBM power bus $306_{12}$ and first dielectric layer 304, and interconnection balls 308 deposited on second dielectric layer 307. Interconnection balls 308 make electrical and mechanical contacts with multi-layer UBM power buses line $306_{12}$. In one embodiment of the present invention, multi-layer UBM power bus $306_{12}$ further comprises an intermediate Under Bump Metallization (UBM) layer $306_1$ served as an adhesive layer, and a thick metal layer $306_2$.

Continuing with the illustration of FIG. 3A, substrate 301 is formed of either silicon (Si), gallium arsenide (GaAs), or any other appropriate metals in which devices such as a high power integrated circuit (not shown) has been formed. Next, array of power buses 302 are arrayed on substrate 301. In one embodiment, array of power buses are drain metals and source metals of high power integrated circuit. Passivation layer 303, formed of either silicon nitride ($Si_3N_4$) or silicon oxide ($SiO_4$) having a typical thickness of about 0.5 μm to 2 μm, substantially covers substrate 301 and stripped to form desired openings. Desired openings are etched by any well-known photo-definition processes along the length of each power bus 302 that defines contact areas 311. In one embodiment of the present invention, an optional dielectric polymer layer of thickness about 2 microns (μm) to 10 microns (μm) may be deposited on passivation layer 301. In an embodiment of the present invention, each multi-layer UBM power bus $306_{12}$ comprises an intermediate underbump metallization (UBM) layer 306, and a thick copper (Cu) layer $306_2$. Intermediate UBM layer 306, and thick copper (Cu) layer $306_2$ have a large surface area and are configured in a geometric shape that extends out from contact areas 311. Thick copper layer $306_2$ is a much thicker layer than intermediate UBM layer $306_1$. Thick copper layer $306_2$ has a thickness between 5-30 microns (μm), depending on the thickness that semiconductor die 300 is designed to handle and on the maximum value allowed by the process. Intermediate UBM layer $306_1$ is a thin titanium-copper (Ti/Cu) and has a thickness of 0.2 micron to 1 micron (μm). In one embodiment, thick copper layer $306_2$ can be a composite of copper (Cu) and chromium (Cr) structure. In one embodiment of the present invention, a Nickel/Gold (Ni/Au) is placed on top of copper (Cu) layer $306_2$ to prevent oxidation of thick copper layer $306_2$.

First dielectric layer 304 and second dielectric layer 307 are of dielectric material types such as polyimide or benzocyclobutene (BCB) based polymer. Both dielectric layers 304 and 307 have a thickness of approximately 5-10 microns (μm). Openings on second dielectric layer 307 are positioned on the surface of thick copper layer $306_2$ to define a solder wettable area where interconnection balls 308 can be deposited. In one embodiment, interconnection balls 308 are solder (Pb/Sn) balls having diameter between 150 microns to 650 microns (μm) formed by conventional electroplating, solder paste, or solder ball placement methods.

Now referring to FIG. 3B, a top plan view of chip scale package 300B that contains semiconductor die 300 shown in FIG. 3A is illustrated. As shown, array of contact areas 311 is exposed and defined by openings. In the present embodiment, different number of openings with various lengths are etched on passivation layer 303 (not shown) and over array of power buses 302 to create contact areas 311. For example, first row and second row each has four contact areas 311, while third row has six contact areas 311. Next, large thick metal layer $306_2$ shown in cross-hatched areas is placed over contact areas 311. In one embodiment, a number of stress relief slots or cuts 310 are formed on the surface of thick metal layer $306_2$ for both thermal and mechanical stress relief. Stress relief slots 310 are adapted to avoid stress related fractures and dislocation in layers immediately beneath UBM layer $306_1$. As shown, interconnection balls 308 are deposited on thick metal layer $306_2$ either directly over contact pads 311 or on the extended portion of multi-layer UBM power buses $306_2$.

The above structure of chip scale package 300B as shown in FIGS. 3A-3B is fabricated by well known integrated circuit and chip scale packaging processes. Accordingly, chip scale package 300B is capable of handling large current and achieving low interconnection resistance by virtue of power bus lines 302 electrically coupled to parallel large and thick multi-layer UBM power buses $306_{12}$ including thick metal layer $306_2$.

Figures 4A, 4B:
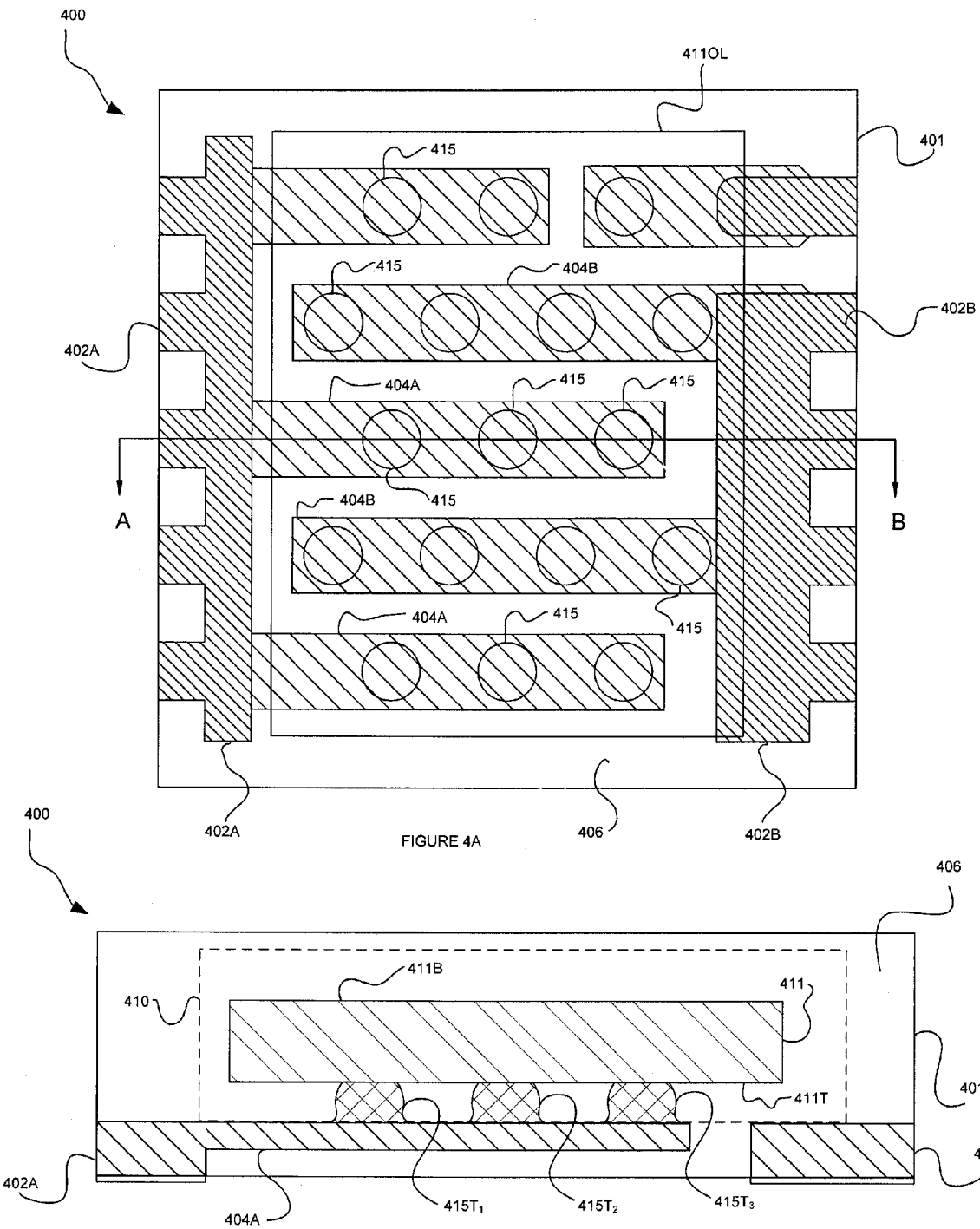
FIG. 4A illustrates a top view of a lead frame structure that contains a chip scale package that has an array of multi-layer Under Bump Metallization (UBM) power buses and an array of power buses in accordance with an embodiment of the present invention.
FIG. 4B illustrates schematic sectional diagram along the AB axis of the lead frame package of FIG. 4A in accordance with an embodiment of the present invention.

Now referring to FIG. 4A, a top view of a high power device 400 that contains a chip scale package attached to a lead frame structure in accordance with an embodiment of the present invention is illustrated. In the present application, the term flip chip attachment means a method of attaching a semiconductor flip chip die (e.g., a chip scale package) to a substrate (e.g., lead frame structure) in which the semiconductor flip chip die is attached to the substrate by means of interconnection balls.

High power device 400 includes a lead frame structure 401 and a semiconductor flip chip die 410 encapsulated in a protective molding material 406. It is noted that semiconductor flip chip die 410 can be any type of package that includes interconnection balls or ball grid array (BGA). In the illustrated embodiment of FIG. 4A, semiconductor flip chip die 410 comprises a chip scale package 411 that is similar to chip scale package 300B as described in FIG. 3A and FIG. 3B. Lead frame structure 401 includes at least two electrical leads that further have a first electrical lead 402A and a second electrical lead 402B. First electrical lead 402A also includes a plurality of finger shaped structures 404A that unilaterally extends outward therefrom. Second electrical lead 402B includes a plurality of finger shaped frames 404B that unilaterally extends outward therefrom. First electrical lead 402A and second electrical lead 402B are juxtaposed next to each other so that plurality of finger shaped structures 404A and plurality of finger shaped structures 404B are co-planar and arranged in an interlacing pattern (inter-digital). On the surface of each finger shaped structures 404A and 404B, a pattern of contact pads 415 where interconnection balls are bonded to lead frame structure 401 are formed. Accordingly, chip scale package 411 makes mechanical and electrical contacts with first electrical lead 402A and second electrical lead 402B.

Next, referring to FIG. 4B, a cross section schematic view of high power device 400 along axis AB is illustrated. As shown, chip scale package 401 is attached to finger shaped metal structure 404A via interconnection balls 308. Along axis AB, only plurality of finger shaped structure 404A of first electrical lead 402A can be seen while plurality of finger shaped structure 404B of second electrical lead 402B is hidden behind plurality of finger shaped structure 402A (finger shaped frames 402A and 402B are co-planar). Chip scale package 411 has an active top side 411T and a corresponding back side 411B. Backside side 411B is a non-active side that does not include integrated circuits. Top side 411T of chip scale package 411 is an active side that includes multi-layer UBM power buses $306_{12}$. As shown in FIG. 4B, lead frame structure 401 and chip scale package 411 is encapsulated by molding compound material 406 with first electrical lead 402A and second electrical lead 402B exposed at their bottom surfaces to make contacts with external circuitry (not shown). In the present embodiment, lead frame structure 401 can be leadless package such as dual flat leadless surface mount (DFN) or quad flat leadless surface mount (QFN). However, it is noted that lead frame structure 401 can be encapsulated in other types of packages that use leaded type packages such as small outline plastic package (SOIC) or thin shrink small outline plastic package (TSSOP), which are within the scope of the present invention.

Lead frame 401 that includes finger shaped metal structures 404A and 404B arranged in inter-digital pattern and a number of devices suitable for use in connection with the present invention are disclosed in an U.S. patent application entitled "A Flip Chip Lead Frame for High Power Device and Method of Making the Same" filed on Aug. 24, 2006 and having Ser. No. 60/840,237, the disclosure of which is hereby incorporated by reference.

Referring again to FIG. 4A and FIG. 4B with such arrangement of lead frame structure 401, lead frame structure 401 reduces total circuit resistance ($R_{TOT}$), thus reducing heat generated by high current. More particularly, the total resistance of lead frame structure 401 equals to the sum of the device resistance ($R_{DS(ON)}$), the interconnection resistance ($R_{INT}$), and the package resistance ($R_P$), $R_{TOT}=R_{INT}+R_{DS(ON)}+R_P$. The parallel and interlacing plurality of finger shaped structures 404A and plurality of finger shaped structures 404B reduce package resistance ($R_P$). The use of interconnection balls $415T_1$, $415T_2$, and $415T_3$ further reduces interconnection resistance ($R_{INT}$) and the device resistance ($R_{DS(ON)}$). In addition, thick copper finger shaped structures 404A and 404B enable chip scale package 411 to carry large current.

Figure 5:
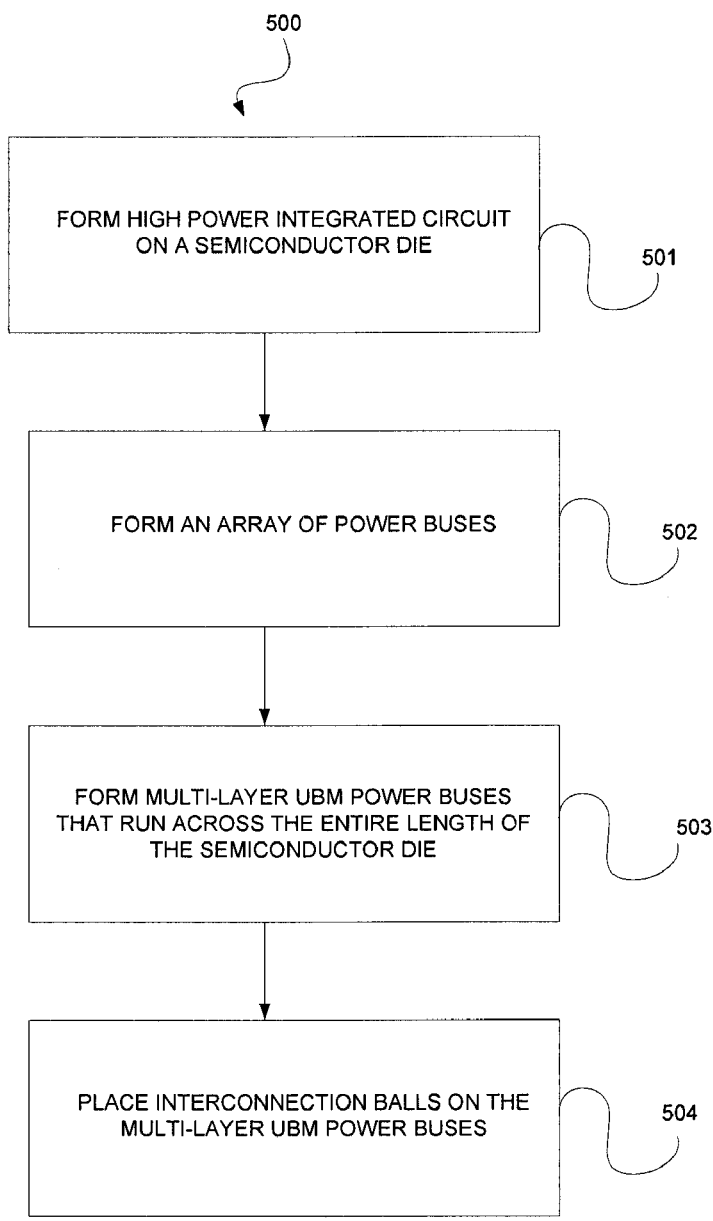
FIG. 5 showing a flow chart of a process of making a chip scale package for high power integrated circuits in accordance with an embodiment of the present invention.

Referring to FIG. 5, a process 500 for manufacturing a chip scale package for high power integrated circuit capable of handling large current, achieving a low interconnection resistance is shown. Process 500 includes the steps of forming a high power integrated circuit on a semiconductor die, forming an array of power buses over the high power integrated circuit, forming multi-layer Under Bump Metallization power buses including a thick metal layer over each of the array of power buses and parallel to one another, whereupon the multi-layer UBM power bus lines are electrically coupled to the high power integrated circuit; and, finally, forming an array of interconnection balls on the multi-layer UBM power buses.

Referring to step 501, forming high power integrated circuit on a semiconductor substrate. A semiconductor die is achieved by dividing a defect free silicon (Si) wafer along vertical and horizontal scribe lines into a number of semiconductor dies. The surface of the silicon wafer is cleaned and chemically polished. Next, high power integrated circuit such as high power Metal Oxide Semiconductor Field Effect Transistor (MOSFET) switch-mode voltage regulator is formed in a semiconductor die by the conventional planar process. In one embodiment, high power MOSFET switch-mode voltage regulator circuit is partitioned into a low side array of switch elements and a high side array of switching elements. Each switching element is represented by a transistor bank 206 as shown in FIG. 2.

Now referring to step 502, an array of power buses is formed. Step 502 is implemented by array of power buses 203 of FIGS. 2A-2C or array of power buses 302 of FIG. 3A and FIG. 3B.

Referring now to step 503, a multi-layer UBM pad that includes a thick metal (e.g., Cu) layer of a predetermined thickness and geometrical shape are formed over the openings. Step 503 is implemented by multi-layer UBM power buses $306_{12}$ described in details in FIG. 3A and FIG. 3B. Furthermore, the multi-layer UBM power buses of step 503 can be formed by chemical vapor deposition (CVD), plasma enhanced chemical vapor deposition (PECVD), or physical vapor deposition (PVD) including sputtering or evaporation processes.

Finally, referring to step 504, interconnection balls are deposited on multi-layer UBM power buses at a predetermined pitch and distance. The predetermined pitch is defined by the industrial standard. More particularly, a second non-solderable dielectric layer is first deposited over the first dielectric layer and the thick copper UBM layer of multi-layer UBM power buses. Openings are patterned over the second dielectric layer and thick metal layer so that interconnection balls can be placed, reflowed, and cooled down to make contact with external devices. Interconnection balls have low interconnection resistance in comparison to wire bonds. In one embodiment, interconnection balls can be solder balls which is deposited over the multi-layer UBM power buses by solder ball placement or by screen printing solder paste methods. In another embodiment, interconnection balls can be plated balls.

Thus, the present invention provides a package the meets very low interconnection resistance and optimal heat flow properties for semiconductor devices, especially high power integrated circuitry, in a chip scale package with superior thermal performance. The packaging concept in accordance with the present invention conforms to a chip scale definition whose package size is 1.8 times its diesize. The lead frame is designed such that it helps the chip to handle large current and reduces interconnection layers.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A chip scale package for a high power integrated circuit, comprising:
    a semiconductor die having a die length and an array of power buses electrically coupled to said high power integrated circuit, said individual power buses having a width substantially smaller than a length of said individual power buses, wherein said length of said individual power buses spans substantially across the entire die length; and
    a plurality of Under Bump Metallization ("UBM") multi-layer power buses disposed parallel to one another and spanning substantially across the entire die length of said semiconductor die, said plurality of multi-layer UBM power buses being electrically coupled to said array of power buses respectively, and wherein said plurality of multi-layer UBM power buses further individually include a metal layer configured in a geometric shape to receive a plurality of interconnection balls respectively.

2. The chip scale package of claim 1 further comprising a passivation layer over said high power integrated circuit, said passivation layer comprising at least one opening that define contact areas through which said plurality of multi-layer UBM power buses make electrical contacts with said array of power buses.

3. The chip scale package of claim 2 further comprising a first dielectric layer disposed over said passivation layer.

4. The chip scale package of claim 3 further comprising a second dielectric layer directly on said multi-layer UBM power buses and having second openings configured to receive said interconnection balls.

5. The chip scale package of claim 2 wherein each of said plurality of multi-layer UBM power buses further comprises an intermediate Under Bump Metallization (UBM) layer over each of said contact areas and said passivation layer, said intermediate UBM layer being electrically coupled to said high power integrated circuit via said openings.

6. The chip scale package of claim 5 wherein said intermediate UBM layer comprises a titanium/copper (Ti/Cu) alloy and having a sub-micron thickness.

7. The chip scale package of claim 2 wherein each of said multi-layer UBM power buses has a geometric shape that extends substantially away from an edge of said openings and has a surface area substantially larger than that of each of said contact areas.

8. The chip scale package of claim 7 wherein each of said multi-layer UBM power buses comprises a plurality of stress relief slots.

9. The chip scale package of claim 1 wherein said thick metal layer comprises a copper (Cu) material and has a thickness between 5 microns to 30 microns (μm).

10. The chip scale package of claim 1 wherein each of said interconnection balls comprise solder balls, each having a diameter between 50 to 650 microns (μm).

11. The chip scale package of claim 1 wherein said interconnection balls have a pitch between 300 microns to 1,000 microns.

12. The chip scale package of claim 1 wherein said power integrated circuit further comprises:
an array of transistor banks, each of said transistor bank further comprising a plurality of transistors; and
each of said array power buses further comprises a drain power bus, and a source power bus, said drain power bus electrically connecting all the drains of said plurality of transistors and said source power bus electrically connecting all the sources of said plurality of transistors within said transistor bank, wherein said multi-layer UBM power buses are parallel over said drain power bus and said source power bus for communicating with said power integrated circuit.

13. The chip scale package of claim 12 wherein each of said plurality of transistors comprises Double Diffused Metal Oxide Semiconductor (DMOS).

14. A chip scale package, comprising:
a semiconductor die having a die length and an integrated circuit and an array of power buses electrically coupled to the integrated circuit;
a passivation layer over the integrated circuit, the passivation layer having an opening;
a plurality of Under Bump Metallization ("UBM") multi-layer power buses disposed parallel to one another and spanning substantially across the entire die length of the semiconductor die, the plurality of multi-layer UBM power buses being electrically coupled to the array of power buses respectively through the opening in the passivation layer;
wherein each of the multi-layer UBM power buses has a geometric shape that extends substantially away from an edge of the openings and has a surface area substantially larger than that of each of the contact areas, and wherein each of the multi-layer UBM power buses comprises a stress relief slot.

15. The chip scale package of claim 14 further comprising a first dielectric layer over the passivation layer.

16. The chip scale package of claim 15, wherein the opening is a first opening, and wherein the chip scale package further comprises a second dielectric layer directly on the multi-layer UBM power buses and having a second opening configured to receive a solder ball.

17. The chip scale package of claim 14 wherein the integrated circuit further includes:
an array of transistor banks, each of the transistor banks further comprising a plurality of transistors; and
each of the array power buses further comprises a drain power bus, and a source power bus, the drain power bus electrically connecting all the drains of the plurality of transistors and the source power bus electrically connecting all the sources of the plurality of transistors within the transistor bank, wherein the multi-layer UBM power buses are parallel over the drain power bus and the source power bus for communicating with the power integrated circuit.

18. A chip scale package, comprising:
a semiconductor die having a die length and an integrated circuit and an array of power buses electrically coupled to the integrated circuit;
a passivation layer on the semiconductor die, the passivation layer having an opening; and
an array of UBM multilayer power buses on the passivation layer, the UBM multi-layer power buses spanning substantially across the entire die length of the semiconductor die, the UBM multi-layer power buses being electrically coupled to the respective power buses through the opening in the passivation layer and each having a stress relief slot.

19. The chip scale package of claim 18 further comprising a first dielectric layer over the passivation layer.

20. The chip scale package of claim 19 wherein the opening is a first opening, and wherein the chip scale package further comprises a second dielectric layer directly on the multi-layer UBM power buses and having a second opening configured to receive a solder ball.

21. The chip scale package of claim 18 wherein the integrated circuit further includes:
an array of transistor banks, each of the transistor banks further comprising a plurality of transistors; and
each of the array power buses further comprises a drain power bus, and a source power bus, the drain power bus electrically connecting all the drains of the plurality of transistors and the source power bus electrically connecting all the sources of the plurality of transistors within the transistor bank, wherein the multi-layer UBM power buses are parallel over the drain power bus and the source power bus for communicating with the power integrated circuit.

* * * * *